United States Patent [19]

Allen et al.

[11] Patent Number: 4,572,970
[45] Date of Patent: Feb. 25, 1986

[54] MILLER CAPACITANCE EFFECT ELIMINATOR FOR USE WITH A PUSH-PULL AMPLIFIER OUTPUT STAGE

[75] Inventors: Gordon H. Allen; Kenneth I. Ray, both of Mesa, Ariz.

[73] Assignee: Motorola, Inc., Schaumburg, Ill.

[21] Appl. No.: 442,937

[22] Filed: Nov. 19, 1982

[51] Int. Cl.⁴ .......................................... H03K 17/00
[52] U.S. Cl. .................................. 307/254; 307/270; 307/300; 307/473
[58] Field of Search ............... 307/254, 270, 455, 300, 307/473; 330/255, 262

[56] References Cited

U.S. PATENT DOCUMENTS

| | | | |
|---|---|---|---|
| 3,824,408 | 7/1974 | Brunel | 307/300 |
| 4,092,551 | 5/1978 | Howart et al. | 307/300 |
| 4,132,906 | 1/1979 | Allen | 307/300 |
| 4,329,600 | 5/1982 | Stewart | 307/270 |
| 4,413,191 | 11/1983 | Houghton | 307/270 |

Primary Examiner—Stanley D. Miller
Assistant Examiner—B. P. Davis
Attorney, Agent, or Firm—Michael D. Bingham

[57] ABSTRACT

A feedback circuit is provided between the output and the input of a lower transistor amplifier of a push-pull amplifier driver output stage to inhibit power supply transients as the amplifier output stage transitions rapidly from a low to high output state. Additionally, if the push-pull output stage is incorporated within a three state gate or the like, which gate shares a common bus with other like three state gates, the feedback circuit inhibits loading of the bus whenever the three state gate is operated in a three state mode or is powered down as the other gates are active and are rapidly transitioned between low and high output states. The feedback circuit provides a low impedance path at the input of the lower transistor amplifier of the push-pull driver output stage to shunt transient currents harmlessly away from the base thereof to prevent the transient currents from turning on the lower transistor amplifier.

14 Claims, 1 Drawing Figure

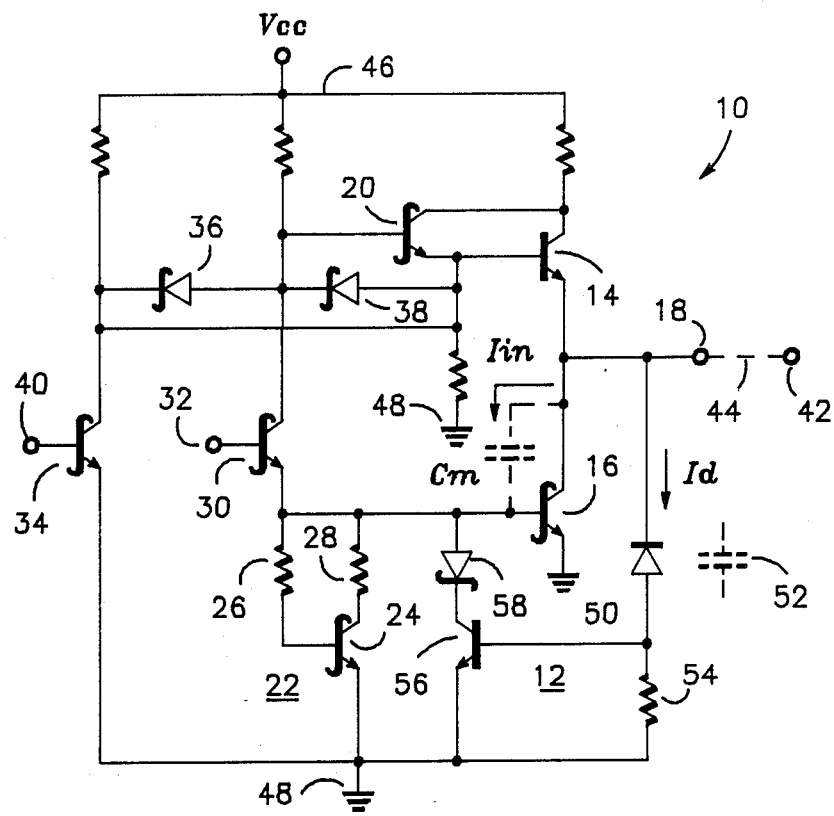

MILLER CAPACITANCE EFFECT ELIMINATOR FOR USE WITH A PUSH-PULL AMPLIFIER OUTPUT STAGE

BACKGROUND OF THE INVENTION

This invention relates to integrated circuits (IC) comprising a push-pull output driver stage and, more particularly, to a circuit for inhibiting the alternating current (AC) Miller capacitance effect to thereby increase the switching speed and to reduce and/or eliminate transient spikes.

Many bipolar integrated digital logic and interface circuits include a push-pull output driver stage formed by an upper and a lower transistor amplifier connected in cascade between power supply leads. The output of the driver stage is interconnected between the upper and lower transistor amplifiers to a load as is known. For example, U.S. Pat. No. 4,132,906 discloses such a circuit. In order to provide large amounts of output drive current the two transistor amplifiers are typically fabricated with large geometries which give rise to the well known Miller capacitance effect. i.e., a parasitic capacitance is formed between the collector and the base of the transistors and, in particular, between the collector and base of the lower transistor amplifier.

As fully explained in the above referenced '906 patent, a problem arises in such prior art output driver stages during the rapid low-to-high transition at the output of the circuit which, because of the Miller capacitor, may cause undesired transients to occur while reducing the switching speed of the circuit. The subject 906 patent discloses a circuit for improving the rise time while reducing transients in such driver stages.

A very similar problem occurs in output driver stages of logic circuits incorporating push-pull amplifiers which are operated in a three state, power off and normal modes. Three state gates of the type described herein are well known. Although, the circuit described in the '906 patent works quite well for logic circuits of the type described therein, no protection is provided to eliminate or inhibit transients that may arise when a three state gate is operated in an off or three state mode of operation.

For instance, if several three state gates have their outputs tied to a common shared bus, the gate that is in its three state mode of operation could severely load the driving gate if the Miller capacitor effect should cause the lower transistor amplifier of the gate in the three state mode to be rendered conductive as the driving three state gate rapidly transitions from a low-to-high output state.

Additionally, in a shared, three state bus system, where several three state gates drive a single shared bus, a powered down gate can cause loading of the bus when a powered up gate produces a rapid low-to-high transition to occur on the shared bus line.

Still further, in quite the same manner as described in the above referenced patent, during normal operation of a three state gate, when the upper transistor amplifier is turned on, a voltage transient or spike could be produced through the power supply. Thus, if the output rises rapidly in response to the upper transistor amplifier being turned on the Miller parasitic capacitor formed between the collector and base of the lower transistor amplifier could produce base drive to this amplifier that would otherwise allow it to turn on. Absent a transient inhibiting circuit, the upper transistor amplifier would then be severely loaded. In addition, the wasted, undesirable current transients through the lower transistor amplifier can result in significant die heating at high operating frequencies.

Thus, there exists a need to overcome the above undesired problems that may arise in a utilization of integrated three state logic circuits as well as other integrated interface circuits which include push-pull output driver stages incorporated therein.

SUMMARY OF THE INVENTION

Accordingly, it is an object of the present invention to provide circuitry to inhibit effects of a Miller capacitance associated with a push-pull output driver stage of an integrated circuit.

Another object of the present invention is to provide improved circuitry to inhibit transient spikes in a push-pull output stage of an integrated logic circuit as the logic circuit transitions from a low to high output state.

It is another object of the present invention to provide circuitry in the push-pull output stage of a three state operated integrated circuit gate to prevent undesired current transients during normal rapid low to high output transition thereof.

Still another object of the present invention is to provide circuitry for utilization in the push-pull output stage of a three state gate to inhibit loading by the gate on a shared bus connected with outputs of other like three state gates.

A further object of the present invention is to provide an improved Miller capacitance effect eliminator circuit which is coupled between the collector and base of a transistor utilized in an amplifier circuit wherein the collector is coupled to an output of the amplifier and which can be operated in an open-collector state, the eliminator circuit increasing the switching speed and inhibiting turn on of the transistor during a rapid low-to-high transition at the output of the amplifier.

In accordance with the above and other objects there is provided circuit means coupled between the output of an amplifier stage having a transistor with its collector coupled to the output of the amplifier stage and an input to the amplifier stage for improving the switching speed of the circuit and for inhibiting current transients as the output of the amplifier stage rapidly transitions from a low to a high output state. In addition, the circuit means inhibits transient spikes from occurring through the power supply that is coupled to the circuit during the aforementioned transition of the output.

A feature of the subject invention is that the integrated circuit, including the circuit means of the subject invention, may be a three state gate the output of which is coupled with the output of other like gates to a common bus line. The circuit means inhibits loading by the three state gate on the common bus whenever the latter is either powered down or operated in its three state mode as other shared three state gates transition from a low output to a high output state.

BRIEF DESCRIPTION OF THE DRAWING

The sole Figure is a schematic diagram illustrating a three state logic circuit including circuit means of the preferred embodiment of the invention.

DETAILED DESCRIPTION OF THE PREFERRED EMBODIMENT

The sole Figure shows a typical three state gate 10 including Miller capacitance effect eliminator feedback circuit 12 of the preferred embodiment. It is to be recognized that although the preferred embodiment is utilized in a three state gate circuit that any logic circuit or interface circuit incorporating a push-pull driver output stage may include the circuit of the present invention. Further, those skilled in the art will understand from reading the subject disclosure that the subject Miller capacitance eliminator circuit of the present invention may be utilized in any circuit wherein the collector of a transistor is coupled to an output and which transistor may be operated in an open-collector state. The three state gate 10 comprises a push-pull output driver stage which includes upper transistor amplifier 14 and lower transistor amplifier 16 connected in cascade between power supply conductors. The output of the circuit is taken at output 18. It is noted that specific elements are not called out in description as these elements provide conventional biasing for the operation of the three state gate.

The push-pull output driver stage also includes transistor 20 connected to upper transistor 14 in a Darlington amplifier configuration. A standard "mule pull-down" circuit 22 consisting of transistor 24 and resistors 26 and 28 is connected to the base of transistor 16 to aid in increasing the switching speed of the output stage. The mule pull-down circuit is fully described in U.S. Pat. No. Re. 27,804 and is therefore not described hereinafter.

The push-pull output driver stage is driven from transistor 30 in a conventional manner. The three state gate is driven from input signals that are supplied at an input to the gate and coupled to the base of transistor 30 at terminal 32 through any number of intermediate amplifier stages which are conventional in manner and thus are not shown. For example, U.S. Pat. No. 4,132,906 which has been previously mentioned and which is incorporated herein by reference made thereto shows standard circuitry that is utilized to drive transistor 30. For present discussion purposes, transistor 30 may be seen as corresponding to transistor 32 of the referenced patent.

In normal operation, in response to signals applied at terminal 32, transistors 14 and 16 are alternately switched between conducting and nonconducting states. If transistor 14 is conducting, current is sourced from its emitter to output terminal 18 of the gate. Similarly, if transistor 16 is conducting (transistor 14 nonconducting) current is sourced therethrough from output terminal 18: the output is in a low output state.

Transistor 34 and the associated circuitry including diodes 36 and 38 are provided to place both transistors 14 and 16 in a nonconducting state in response to a three state input control signal being supplied at terminal 40 to the base of transistor 34. Therefore, if a positive signal is applied to transistor 34, this transistor becomes conductive to starve or shunt current drive away from both transistors 20 and transistor 16. Thus, both transistors 14 and 16 are biased in a nonconducting state which is typically referred to as the three state mode of operation.

As is taught in the above referenced '906 patent, the geometry of the bipolar transistor 16 is such that a parasitic capacitor $C_m$ is formed between the collector and the base thereof. This capacitor and its effect is generally referred to as the Miller capacitance effect. Several undesired problems may result during normal operation of three state gate 10 due to the effects of the capacitor $C_m$ as will hereinafter be explained. For purposes of the invention, a broken line is shown between terminals 18 and 42 to indicate a common bus line 44 to which may be coupled the outputs of several three state gates in a conventional well known manner.

In a three state mode of operation, transistor 34 is turned on and upper and lower transistor amplifiers 14 and 16 are turned off or nonconducting. If another three state gate is actively driving the shared bus (at terminal 42) without feedback circuit means 12, a rapid low-to-high transition on the bus due to the transitioning of the driving three state gate may cause a current $I_m$ to flow through capacitor $C_m$ to turn on transistor 16. This condition could severely load the driving gate which is undesired. Similarly, if three state gate 10 is powered down, $V_{cc}$ removed, transistors 14 and 16 are again in a three state mode or nonconducting. A fast rising pulse appearing at terminal 42 on shared bus 44 from the output of a powered up three state gate that is connected to terminal 42 can cause transistor 16 to turn on as aforedescribed to load the output of the powered up gate. Hence, without circuit means 12, severe loading of other gates coupled to shared bus 44 may arise.

Still another undesired condition may arise when three state gate 10 is actively driving bus 44 in a normal mode of operation with transistors 14 and 16 being alternately switched on and off under light capacitive loads. Hence, if transistor 14 is turned on sufficiently fast, the Miller capacitance effect could produce a current $I_m$ that flows from the emitter of transistor 14 to the base of transistor 16 through $C_m$ which may turn the latter on. If this occurs, transistor 14 is severely loaded to produce a current transient or spike through the power supply that is connected thereto at power supply conductor 46. In addition to the spike, the wasted current through transistor 16 can result in significant die heating of the integrated gate circuit at high operating frequencies.

Circuit means 12 eliminates and/or severely inhibits the Miller capacitance effects described above. Circuit means 12 includes a diode 50, which is utilized to provide capacitance 52 when reverse biased, that is coupled between output 18 and ground reference potential via resistor 54 to the base electrode of transistor 56. The collector-emitter path of transistor 56 is series connected through Schottky diode 58 between the base of lower transistor amplifier 16 and the power supply conductor 48.

In response to a rapid low to high transitions at output 18, diode 50 is reverse biased such that current $I_d$ would flow through the diode capacitance 52 to turn on transistor 56 simultaneously to any Miller current $I_m$ flowing through capacitor $C_m$. Transistor 56 thus diverts the current $I_m$ through a low impedance path harmlessly away from the base of transistor 16 to prevent this transistor from being turned on as has previously been described. Hence, loading of bus 44 and power supply spikes are reduced or severly inhibited by circuit means 12 neutralizing the Miller capacitance effect found in the push pull driver output stage.

We claim:

1. In a circuit having a push-pull output stage that includes an upper transistor amplifier and a lower transistor amplifier coupled between first and second power supply conductors and having a circuit output therebetween, the improvement comprising circuit means coupled between the circuit output and the input of the lower transistor amplifier for providing a low impedance path from said input of the lower transistor amplifier and the second power supply conductor whenever rapid low-to-high transitions occurr at the circuit output to shunt current transients to the second power supply conductor that may otherwise occur at said input of the lower transistor.

2. The circuit of claim 1 wherein said circuit means includes:
capacitance means coupled between the circuit output and the second power supply conductor for providing a capacitance during said transitions; and
a transistor having first and second electrodes and a control electrode, said control electrode being coupled to said capacitance means, said first and second electrodes being coupled in a series current path between said input of the lower transistor amplifier and the second power supply conductor.

3. The circuit of claim 2 wherein said capacitance means includes a diode coupled between the output of the circuit and the second power supply conductor which is reverse biased during said transitions.

4. The circuit of claim 3 further including a driver amplifier stage coupled to said input of said lower transistor amplifier and to the input of the upper transistor amplifier which is responsive to switching signals applied to the input thereof for alternately switching the upper and lower transistor amplifiers between off and on operating states.

5. The circuit of claim 4 including transistor switch means coupled with the upper transistor amplifier which is responsive to a control signal applied thereto for simultaneously rendering both upper and lower transistor amplifiers nonconducting.

6. In a logic circuit having a push-pull output stage that includes upper and lower transistor amplifiers coupled in series between first and second power supply conductors for driving a load at an output of the logic circuit taken therebetween, the improvement comprising feedback circuit means connected between the output of the logic circuit and an input of the lower transistor amplifier for providing a low-impedance conduction path from the input of the lower transistor amplifier to the second power supply conductor whenever there is a rapid low-to-high transition at the output of the logic circuit.

7. The logic circuit of claim 6 wherein said feedback circuit means includes:
transistor switching means responsive to a transient turn-on signal applied thereto during said output transition for providing said low-impedance conduction path between said input of the lower transistor amplifier and the second power supply conductor; and
capacitive means coupled between the output of the logic circuit and the transistor switching means for providing said transient turn-on signals.

8. The circuit of claim 7 wherein said capacitive means includes a first diode which is poled to be reverse biased during said transition.

9. The circuit of claim 8 wherein said transistor switching means includes:
a transistor having emitter, collector and base electrodes, said emitter electrode being coupled to the second power supply conductor, said base being coupled to said first diode; and
a second diode coupled between said collector and said input of the lower transistor amplifier.

10. A monolithic integrated three state gate circuit having an output and including a push-pull output stage consisting of an upper and a lower transistor coupled in cascade between first and second power supply conductors with the output of the gate taken therebetween, the output of the gate being adapted to be coupled to a common bus at which other three state gate circuits can be connected, the improvement comprising circuit means coupled between the output of the gate and an input of the lower transistor for providing a low impedance path to the second power supply conductor to shunt transient signals thereto whenever a rapid low-to-high voltage transition occurs at the output of the gate circuit.

11. The gate circuit of claim 10 wherein said circuit means includes:
a transistor having a base, emitter and collector, said emitter being coupled to the second power supply conductor, said collector being coupled to said input of the lower transistor, said transistor being rendered conductive by a transient control signal to provide said low-impedance conduction path; and
a diode coupled between the output of the gate circuit and said base of the transistor for producing said transient control signal during the transition of the output.

12. A circuit for use with a transistor amplifier having a transistor with its collector coupled to an output of the amplifier, which circuit inhibits transient turn on of the transistor during rapid low-to-high transitions at the output of the amplifier, comprising:
capacitance means coupled to the output of the amplifier for producing a biasing signal during the transitions; and
transistor means coupled to the base of the transistor of the amplifier which is responsive to said biasing signal for providing a low impedance path at said base of the transistor to inhibit turn on thereof.

13. The circuit of claim 12 wherein said capacitance means includes a diode coupled between the output of the amplifier and a terminal at which is supplied a reference potential which is reverse biased during said transitions.

14. The circuit of claim 13 wherein said transistor means includes a transistor having its base coupled to said diode, its emitter coupled to said terminal and its collector coupled to said base of the transistor of the amplifier circuit.

* * * * *